(12) United States Patent
Ferns et al.

(10) Patent No.: US 8,666,703 B2
(45) Date of Patent: Mar. 4, 2014

(54) METHOD FOR AUTOMATED DETERMINATION OF AN OPTIMALLY PARAMETERIZED SCATTEROMETRY MODEL

(75) Inventors: Jason Ferns, Cupertino, CA (US); John J. Hench, San Jose, CA (US); Serguei Komarov, Sunnyvale, CA (US); Thaddeus Dziura, San Jose, CA (US)

(73) Assignees: Tokyo Electron Limited, Tokyo (JP); KLA-Tencor Corporation, Milpitas, CA (US)

( * ) Notice: Subject to any disclaimer, the term of this patent is extended or adjusted under 35 U.S.C. 154(b) by 784 days.

(21) Appl. No.: 12/841,932

(22) Filed: Jul. 22, 2010

(65) Prior Publication Data

US 2012/0022836 A1   Jan. 26, 2012

(51) Int. Cl.
| | |
|---|---|
| *G06F 17/50* | (2006.01) |
| *G06F 17/10* | (2006.01) |
| *G06G 7/48* | (2006.01) |
| *H03F 1/26* | (2006.01) |
| *G06F 19/00* | (2011.01) |

(52) U.S. Cl.
USPC ........ 703/1; 703/7; 703/2; 702/196; 702/189; 700/121; 700/108

(58) Field of Classification Search
USPC ............ 703/2, 1; 700/121, 108; 702/196, 189
See application file for complete search history.

(56) References Cited

U.S. PATENT DOCUMENTS

| | | | | |
|---|---|---|---|---|
| 6,721,691 B2 * | 4/2004 | Bao et al. | ...................... | 702/189 |
| 6,842,261 B2 * | 1/2005 | Bao et al. | ...................... | 702/189 |
| 6,853,942 B2 * | 2/2005 | Drege et al. | .................. | 702/189 |
| 7,126,700 B2 * | 10/2006 | Bao et al. | ...................... | 702/189 |
| 7,200,950 B2 * | 4/2007 | Bowes | ............................ | 702/95 |
| 7,602,509 B1 | 10/2009 | Hench | | |
| 7,710,565 B2 * | 5/2010 | Kaushal et al. | ............... | 356/392 |
| 8,108,328 B2 * | 1/2012 | Hench | ............................. | 706/16 |
| 8,122,389 B2 * | 2/2012 | Sezginer et al. | ................ | 716/51 |
| 8,165,854 B1 * | 4/2012 | Wei | .................................... | 703/2 |
| 8,239,786 B2 * | 8/2012 | Wong et al. | ..................... | 716/51 |
| 8,294,907 B2 * | 10/2012 | Cramer et al. | ................ | 356/625 |

(Continued)

FOREIGN PATENT DOCUMENTS

| | | |
|---|---|---|
| JP | 2003302334 | 10/2003 |
| JP | 2009145323 | 7/2009 |
| KR | 1020090011596 | 2/2009 |

OTHER PUBLICATIONS

Accelerated Optical Topography Inspection Using Parameterized Model Order Reduction; Jung Hoon Lee et al; IEE 2005; pp. 1771-1774.*

(Continued)

*Primary Examiner* — Akash Saxena
(74) *Attorney, Agent, or Firm* — Blakely Sokoloff Taylor & Zafman LLP

(57) ABSTRACT

Provided is an automated determination of an optimized parameterization of a scatterometry model for analysis of a sample diffracting structure having unknown parameters. A preprocessor determines from a plurality of floating model parameters, a reduced set of model parameters which can be reasonably floated in the scatterometry model based on a relative precision for each parameter determined from the Jacobian of measured spectral information with respect to each parameter. The relative precision for each parameter is determined in a manner which accounts for correlation between the parameters for a combination.

17 Claims, 14 Drawing Sheets

(56) References Cited

U.S. PATENT DOCUMENTS

| | | | |
|---|---|---|---|
| 8,346,521 B2* | 1/2013 | Statham et al. | 703/2 |
| 2003/0045976 A1* | 3/2003 | Bechhoefer | 701/29 |
| 2004/0017574 A1 | 1/2004 | Vuong et al. | |
| 2005/0084987 A1* | 4/2005 | Wilson et al. | 703/1 |
| 2006/0009872 A1* | 1/2006 | Prager et al. | 700/121 |
| 2006/0247816 A1 | 11/2006 | Prager et al. | |
| 2006/0248495 A1* | 11/2006 | Sezginer | 703/2 |
| 2007/0225851 A1* | 9/2007 | Prager et al. | 700/121 |
| 2008/0088832 A1* | 4/2008 | Cramer et al. | 356/237.4 |
| 2009/0306941 A1* | 12/2009 | Kotelyanskii et al. | 703/1 |
| 2010/0017351 A1* | 1/2010 | Hench | 706/16 |
| 2011/0115787 A1* | 5/2011 | Kadlec | 702/189 |
| 2011/0231167 A1* | 9/2011 | Cramer et al. | 703/2 |
| 2011/0307424 A1* | 12/2011 | Jin et al. | 706/12 |
| 2012/0158384 A1* | 6/2012 | Wei | 703/2 |
| 2013/0262044 A1* | 10/2013 | Pandev et al. | 703/1 |

OTHER PUBLICATIONS

International Search Report and Written Opinion for Application No. PCT/US2011/044394 dated Mar. 3, 2012, 6 pages.

International Preliminary Report on Patentability for International Application No. PCT/US2011/044394 dated Jan. 31, 2013, 4 pages.

* cited by examiner

METHOD FOR AUTOMATED DETERMINATION OF AN OPTIMALLY PARAMETERIZED SCATTEROMETRY MODEL

TECHNICAL FIELD

Embodiments of the invention pertain to scatterometry and more particularly methods and systems for an automated selection of a set of floating parameters.

BACKGROUND

Optical metrology techniques generally referred to as scatterometry offer the potential to characterize parameters of a workpiece during a manufacturing process. In practice, light is directed onto a periodic grating formed in a workpiece and spectra of reflected light is measured and analyzed to characterize the grating parameters. Characterization parameters may include critical dimensions (CD), sidewall angle (SWA), feature height (HT), etc. which affect the polarization and intensity of the light reflected from or transmitted through a material. Characterization of the grating may thereby characterize the workpiece as well as manufacturing process employed in the formation of the grating and the workpiece. For example, optical metrology system 100 depicted in FIG. 1A can be used to determine the profile of a grating 102 formed on a semiconductor wafer 104. Grating 102 can be formed in test areas on wafer 104, such as adjacent to a device formed on wafer 104. The optical metrology system 100 can include a photometric device with a source 106 and a detector 112. Grating 102 is illuminated by an incident beam 108 from source 106. In the present exemplary embodiment, incident beam 108 is directed onto grating 102 at an angle of incidence $\theta_i$ with respect to normal of grating 102 and an azimuth angle $\phi$ (i.e., the angle between the plane of incidence beam 108 and the direction of the periodicity of grating 102). Diffracted beam 110 leaves at an angle of $\theta_d$ with respect to normal and is received by detector 112. Detector 112 converts the diffracted beam 110 into a measured metrology signal. To determine the profile of grating 102, optical metrology system 100 includes a processing module 114 configured to receive the measured metrology signal and analyze the measured metrology signal.

Analysis of measured spectra generally involves comparing the measured sample spectra to simulated spectra to deduce a scatterometry model's parameter values that best describe the measured sample. As used herein, "model" refers to a scatterometry model and "parameter" refers to a model parameter of the scatterometry model. FIG. 1B illustrates a method 150 for building parameterized scatterometry model (model) and spectra library beginning with sample spectra (e.g., originating from one or more workpieces). At operation 152, a set of material files are accessed. Material files specify characteristics (e.g., n, k values) of the material(s) from which the measured sample feature is formed. The material files may be defined by a user or received from an upstream processor.

At operation 152, an initial scatterometry model is accessed. A scatterometry user may define an initial model of the expected sample structure by selecting one or more of the material files to assemble a stack of materials corresponding to those present in the periodic grating features to be measured. Alternatively, an initial model may be received as output from an automated source. This initial model may be further parameterized through definition of nominal values of model parameters, such as thicknesses, CD, SWA, HT, edge roughness, corner rounding radius, etc. which characterize the shape of the feature being measured. Depending on whether a 2D model (i.e., a profile) or 3D model is defined, it is not uncommon to have 30-50, or more, such model parameters.

From a parameterized model, simulated spectra for a given set of grating model parameter values may be computed using rigorous diffraction modeling algorithms, such as the Rigorous Coupled Wave Analysis (RCWA) method. Regression analysis is then performed at operation 156 until the parameterized model converges on a set of model parameter values characterizing a final profile model that corresponds to a simulated spectrum which matches the measured diffraction spectra to a predefined matching criterion. The final profile model associated with the matching simulated diffraction signal is presumed to represent the actual profile of the structure from which the model was generated.

The matching simulated spectra and/or associated optimized profile model can then be utilized at operation 157 to generate a set of simulated diffraction spectra by perturbing the values of the parameterized final profile model. The resulting set of simulated diffraction spectra may then be employed by a scatterometry measurement system operating in a production environment to determine whether subsequently measured grating structures have been fabricated according to specifications.

During the regression operation 156, simulated spectra from a set of model parameters for a hypothetical profile are fit to the measured sample spectra. With each regression performed to arrive at the next simulated spectra, a decision on which of the model parameters are to be allowed to float (i.e., to vary) and which are to be fixed is needed. Generally, each model parameter allowed to float will render all other floating model parameters less precise and floating too many model parameters that cannot be precisely determined by the spectra may cause regression algorithms to become unstable. Yet, given that at least some of the model parameters must be allowed to float during the regression analysis, decisions pertaining to which model parameters to float and which to fix are currently made by highly trained engineers knowledgeable on both the subject manufacturing process and on scatterometry. This dependence on expert skill at for proper selection of model parameters to float during the regression may add weeks or even months of engineering time to the method 150. Considerable subjectivity in the apparent capability of scatterometry as a measurement technique is also introduced by a user's parameterization decisions. Considering further the multiplicity of measurement collection points typical in a semiconductor process and the frequency of process changes that may necessitate new models, the need to properly parameterize a scatterometry model poses a significant obstacle to widespread adoption of scatterometry.

An automated method for determining an optimal parameterization of a scatterometry model that can be done more quickly, more rigorously, and without reliance on highly skilled users would therefore be advantageous.

BRIEF DESCRIPTION OF THE DRAWINGS

Embodiments of the present invention is illustrated by way of example, and not by way of limitation, in the figures of the accompanying drawings, in which.

SUMMARY

Figure 1A:
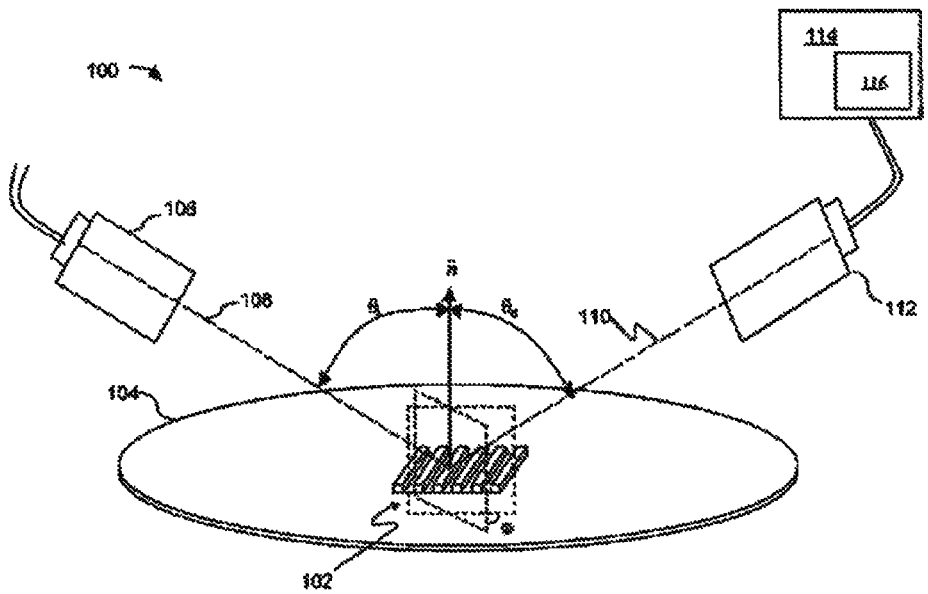
FIG. 1A depicts an exemplary optical metrology device for scatterometry.
Figure 1B:
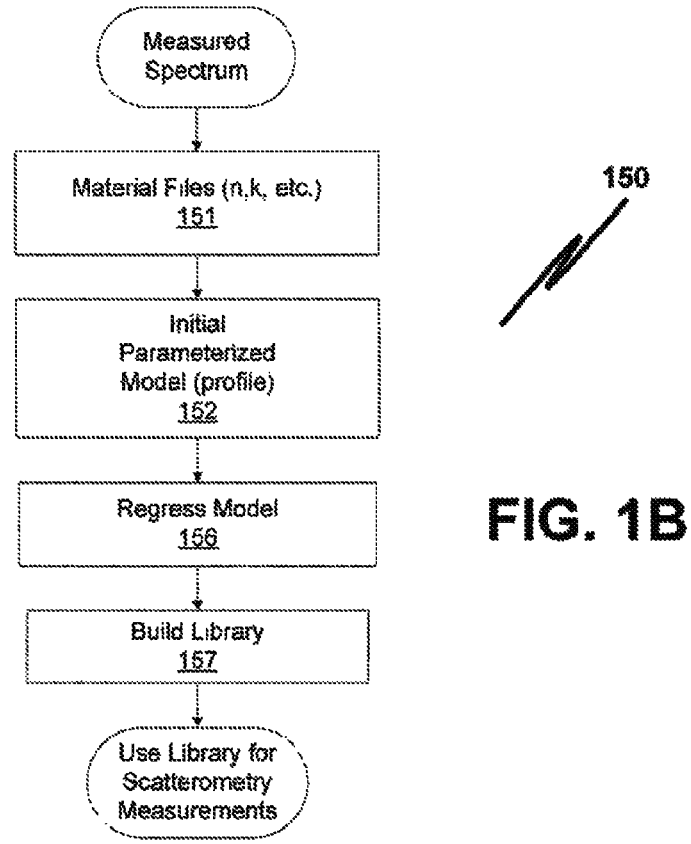
FIG. 1B is a flow diagram illustrating a conventional method for building a scatterometry model and a spectra library.

Scatterometry based measurements are made by measuring spectral information from periodic structures and solving an inverse problem whereby the measured spectral information is matched via an optimization process to spectral information produced synthetically, or simulated, from a parameterized model. Typically the model will be parameterized with many more model parameters than can be varied (floated) by the optimization process. This requires a large number of model parameters to be fixed to a nominal value with a lesser number being floated.

Embodiments herein describe methods, computer program products and optical metrology systems to determine a set of model parameters that are to be fixed (floated) during a regression of parameterized model for scatterometry analysis of a sample diffracting structure having unknown model parameters.

In an embodiment, measured spectral information is received and a scatterometry model having a plurality (N) of model parameters floating is accessed. A Jacobian matrix (Jacobian) of the measured spectral information is calculated and, based on a precision metric determined from the Jacobian and spectral covariance matrix for each model parameter in a plurality of parameter combinations, a set of model parameters to be fixed at a predetermined parameter value is determined. In certain embodiments, the plurality of model parameter combinations may be assembled from columns of the Jacobian (with the Jacobian calculated only once for all model parameters) and a combinatoric search or bottom-up or top-down ordering of the combinations performed to identify the best group of model parameters to float in concert.

In further embodiments, a regression is run on the measured spectral information with the revised scatterometry model. The values of fixed model parameters having a relative precision metric that is sufficiently high that they cannot be reasonably floated in the scatterometry model are verified and updated from the nominal values, if significantly different. The fixed/float determination may then be looped to re-calculate the Jacobian matrix and re-select the fixed/floated parameter sets. In an embodiment, with a maximum degree of freedom model automatically identified, regression-based techniques are applied and additional parameters are automatically fixed in an iterative manner based on a weighted sum of total estimated error to arrive at a final, optimally parameterized model.

DETAILED DESCRIPTION

In the following description, numerous details are set forth. It will be apparent, however, to one skilled in the art, that the present invention may be practiced without these specific details. For example, while the present methods are described in the context of scatterometry for diffraction grating parameter measurements, it should be appreciated that the methods may be readily adaptable to other contexts and applications by one of ordinary skill in the art.

In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Some portions of the detailed descriptions provide herein are presented in terms of algorithms and symbolic representations of operations on data bits within a computer memory. Unless specifically stated otherwise, as apparent from the following discussion, it is appreciated that throughout the description, discussions utilizing terms such as "calculating," "determining" "estimating" "storing" "collecting" "displaying," "receiving," "consolidating," "generating," "updating," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In embodiments, preprocessing of a nominal model, such as one initially provided by a user, is performed to stabilize the model input into a regression-based model refiner by determining a maximum number of model parameters that can be reasonably floated in the model. As such, the preprocessing does not determine a final model, but rather performs operations designed to eliminate any need for an expert user to first manually reduce the set of floating parameters in the model input into the model refiner. In the exemplary method 200 depicted in FIG. 2A, a parameterized model is accessed at operation 201. An optimization of the model parameterization is performed prior to performing regression of the model at operation 206 to solve the inverse problem.

In an embodiment, the optimization 205 is separated into a model preprocessing operation 203 and a model refinement operation 204. As further shown in FIG. 2B, which illustrates a relative parameter precision metric as a function of the number of parameters in the model, the preprocessing and refinement operations 203, 204 complement each other by dividing the model parameters into three categories: parameters 208 which must be fixed and parameters 209 which must be floated for a stable model, and parameters 210 which are the remainder. The preprocessing operation 203 discerns which model parameters fall into either or both of 208, 209 and the refinement operation 204 discerns whether to fix or float the parameters 210 in the remaining category. As further illustrated in FIG. 2B, the relative precision metric has guard bands defining a threshold range (e.g., 0.1 to 10) that may be user configurable. This threshold range includes a portion of the range over which the preprocessing operation will determine to fix a parameter (e.g., 1 to 10). For parameters 208 falling in the threshold range, certain embodiments perform a verification regression as part of the preprocessing operation 203.

In addition to the different objectives of the operations 203 and 204, another salient distinction between the two operations is the methods by which the respective objectives are achieved. Generally, the preprocessing operation 203 makes decisions on whether a parameter is to be fixed or floated based on a precision metric for that model parameter determined from the Jacobian of the measured spectral information with respect to the model parameters to preferentially fix those parameters which cannot be precisely determined from measured spectral information (e.g., where $$\frac{\partial_{spectra}}{\partial x}$$

is small, with x being the model parameter vector). In further embodiments, the optimization operation 203 determines a relative precision metric for a parameter as a function of the precision metric and an expected process variation associated with the parameter to also fix those parameters which will not vary much as a matter of course in the manufacturing process.

As described further elsewhere herein, this Jacobian-based preprocessing can be done very efficiently and in a manner which can handle a larger number of model parameters left floating (30-50, or more) in the initial model.

Once the preprocessing operation 203 is completed, the revised model is then input to the model refining operation 204 in which regression intensive techniques may be employed to consider additional factors, such as additional spectral information characterizing within sample variation, etc. During the model refining operation 204, additional parameters beyond the set identified in the preprocessing operation 203 may be fixed based on a combined statistical merit function, such as a total estimated error (TEE), as described further elsewhere herein.

Figure 2A:
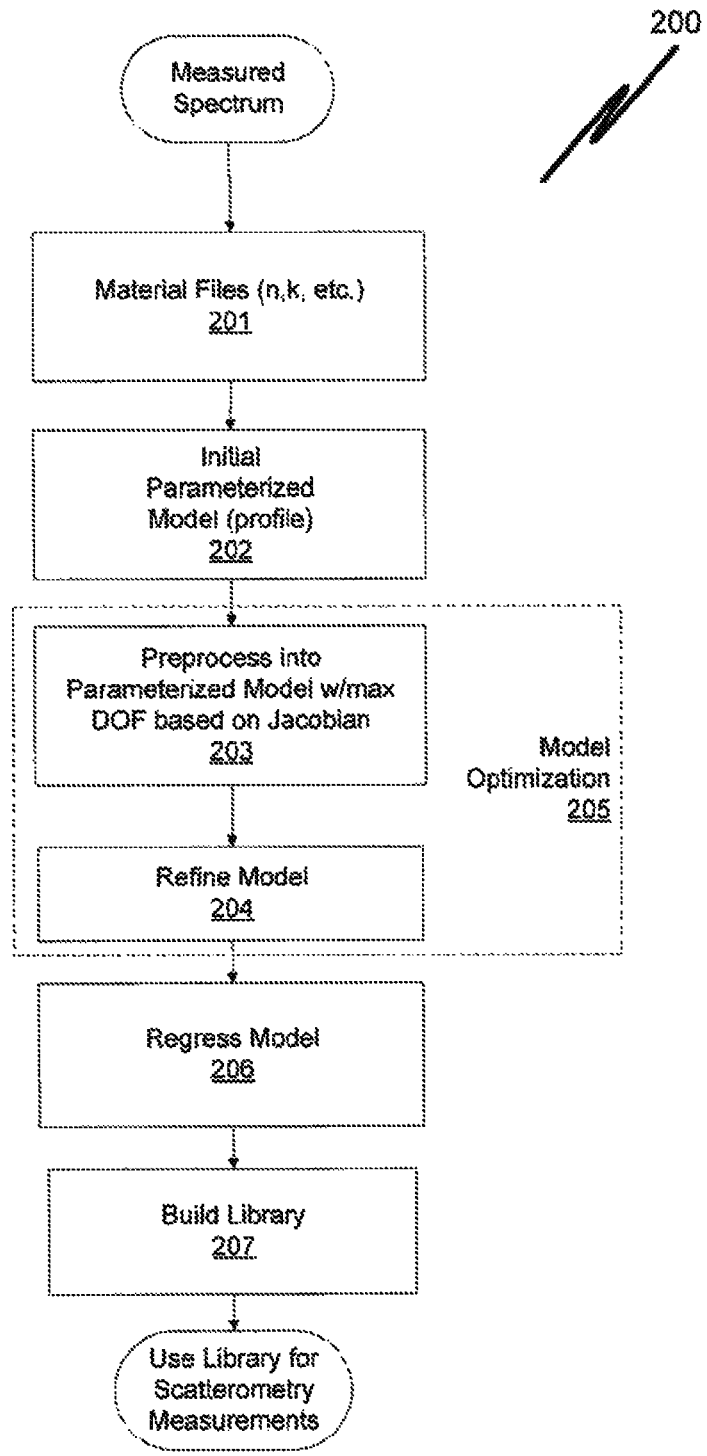
FIG. 2A is a flow diagram illustrating an exemplary automated method for determining an optimal parameterization of a scatterometry model, in accordance with an embodiment.
Figure 2B:
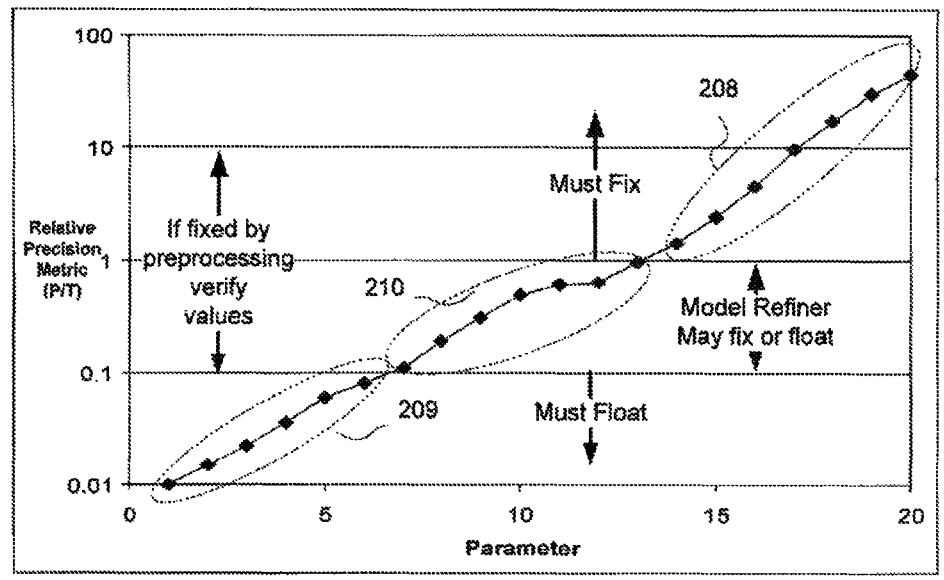
FIG. 2B illustrates a model parameter precision metric as a function of a the number of parameters in the model and a processing of such parameters, in accordance with an embodiment.
Figure 2C:
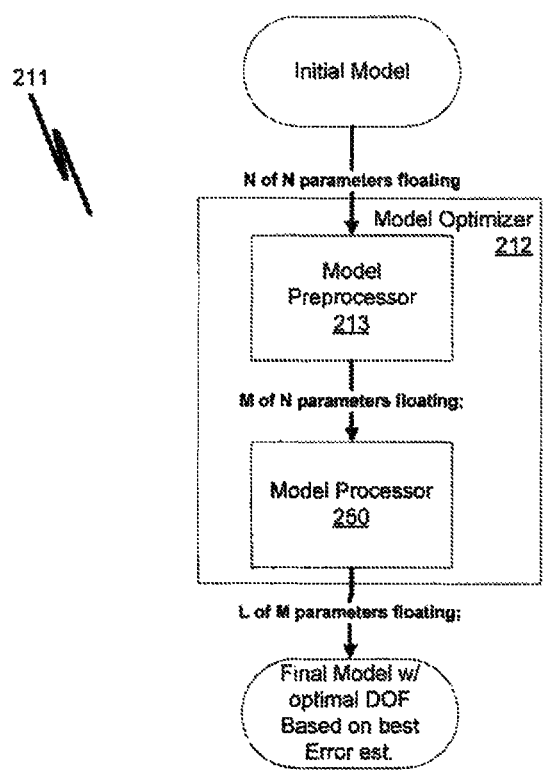
FIG. 2C is an exemplary system to automatically determine an optimal parameterization of a scatterometry model, in accordance with an embodiment.

FIG. 2C is an exemplary optical metrology system 211 configured to automatically optimize parameterization of a scatterometry model, in accordance with embodiments described herein. The optical metrology system 211 is configured to include a model optimizer 212 to receive or access an initial model having a large number (e.g., 30-50, or more) of parameters, N, or mathematical combinations of parameters, all of which may be left floating. From the set of N floating parameters, a model preprocessor 213 executes preprocessing operation 203 to identify the set of parameters which either so weakly affect the spectral measurement or which so greatly affect the spectral measurement that the parameters must either be fixed or floated, respectively, to enable subsequent generation of a final model with lowest uncertainty. With the parameterization so specified, a stable model with a reduced set (M of N) of floatable parameters is input to the model processor 250 to execute the model refinement operation 204 during which additional parameters may be fixed to output a final model having L of M parameters floating based on a best error estimate of parameters deemed critical either be default or by user-definition. From this final model a simulated spectral information library may be generated and unknown parameters of a sample diffracting structure may be deduced using any of the known scatterometry techniques. It is to be appreciated that either or both of the model preprocessor 213 and model processor 250 may be implemented as either software or hardware, or a combination thereof. For example, in one embodiment, one or more general purpose computer processing units, as described elsewhere herein, are configured through instructions stored on a computer readable media to be the model preprocessor 213 and/or model processor 250.

Figure 3:
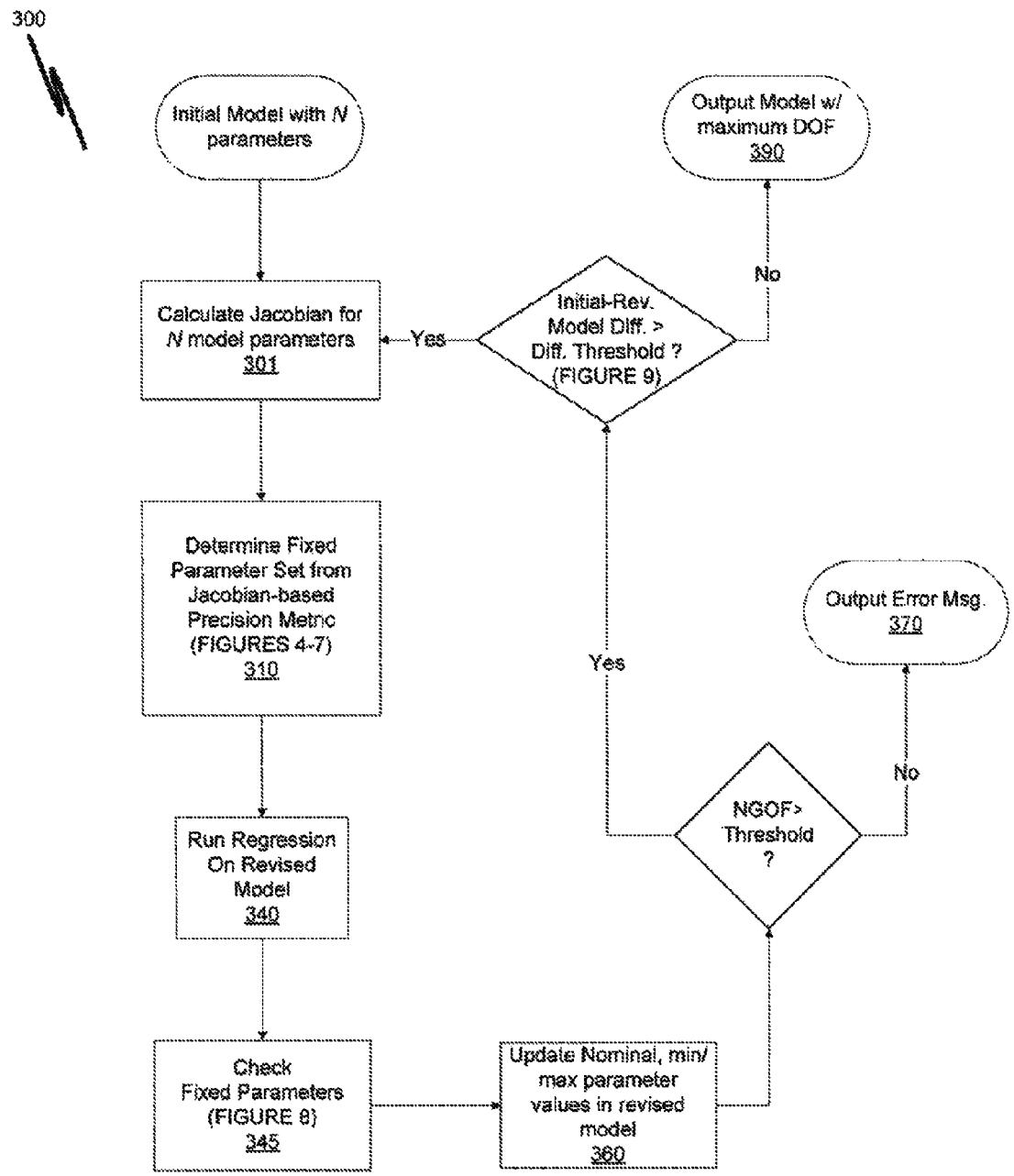
FIG. 3 is a flow diagram illustrating an exemplary method for determining a maximum DOF parameterization of a scatterometry model, in accordance with an embodiment.

FIG. 3 is a flow diagram illustrating a preprocessing method 300, which is one exemplary embodiment of the preprocessing operation 203 depicted in FIG. 2A for determining parameterization of a scatterometry model having maximum degrees of freedom (DOF). Method 300 begins at operation 301 with a calculation of the Jacobian, $J_o$, for all N model parameters input as an initial model. $J_o$ represents the derivative of a spectral signal measured by the optical metrology system with respect to each of the N measurement parameters. $J_o$ therefore has a column for each of the N model parameters and a row for each spectral wavelength comprising the measured spectral information.

Figure 4A:
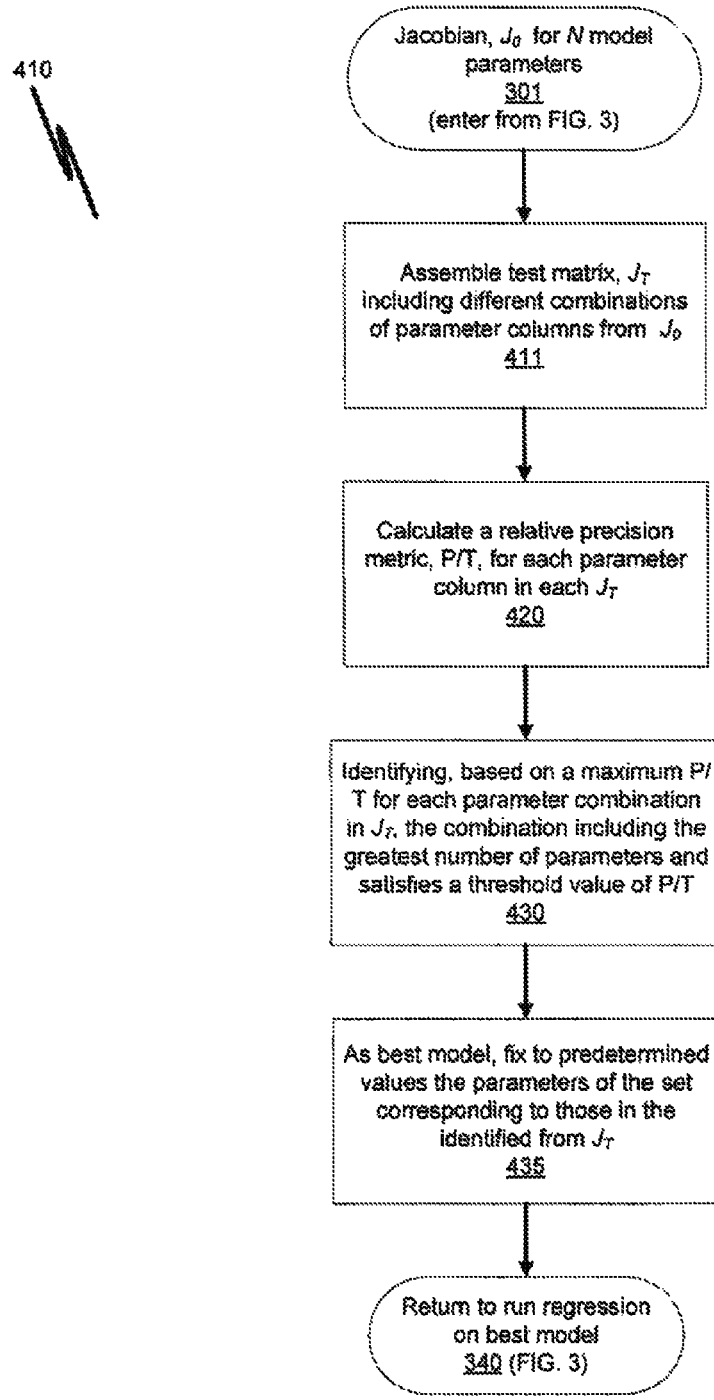
FIG. 4A is a flow diagram illustrating an exemplary method for determining a fixed model parameter set based on a precision metric derived from the Jacobian of measured spectral information, in accordance with an embodiment.

The method 300 then proceeds to operation 310 to determine a fixed parameter set based on parameter precision metrics determined from $J_o$. Generally, the precision metric is calculated at operation 310 in a manner which takes into account parameter correlations to provide a basis for comparing various combinations of floating parameters and identify the largest set of parameters which can be reasonably floated. FIG. 4A illustrates one exemplary method for determining the fixed parameter set at operation 310 of FIG. 3. As shown in FIG. 4A, the method 410 takes as an input $J_0$ and at operation 411 assembles a test matrix, $J_T$, by copying or deleting certain columns from $J_0$, each $J_T$ to include a plurality of combinations of parameter columns from $J_0$. Notably, the Jacobian, $J_0$, need only be calculated once (e.g., at operation 301) to arrive at the set of parameters to be fixed. The test matrix $J_T$ is merely a side-by-side concatenation of columns from $J_0$ and therefore while being a Jacobian itself, the "assembly" of $J_T$ requires orders of magnitude less time to assemble than it takes to actually calculate the elements of the Jacobian $J_0$.

At operation 420, a relative precision metric is calculated for each parameter column in each of the plurality of combinations. The relative precision metric is a function of the hardware precision for the parameter and the expected process variation associated with that parameter. In one embodiment, the relative precision metric is a normalized estimated hardware precision for each floating parameter (estimated Hardware Precision/estimated Process Variation (HP/PV), referred to herein as the Precision/Tolerance (P/T) ratio). The process variation or tolerance default value may be set to a 3σ process variation known to the user and may be configurable at the parameter level, such as, but not limited to ±5% for physical dimension parameters (e.g., nanometer units) and ±1% for SWA parameters.

Figure 4B:
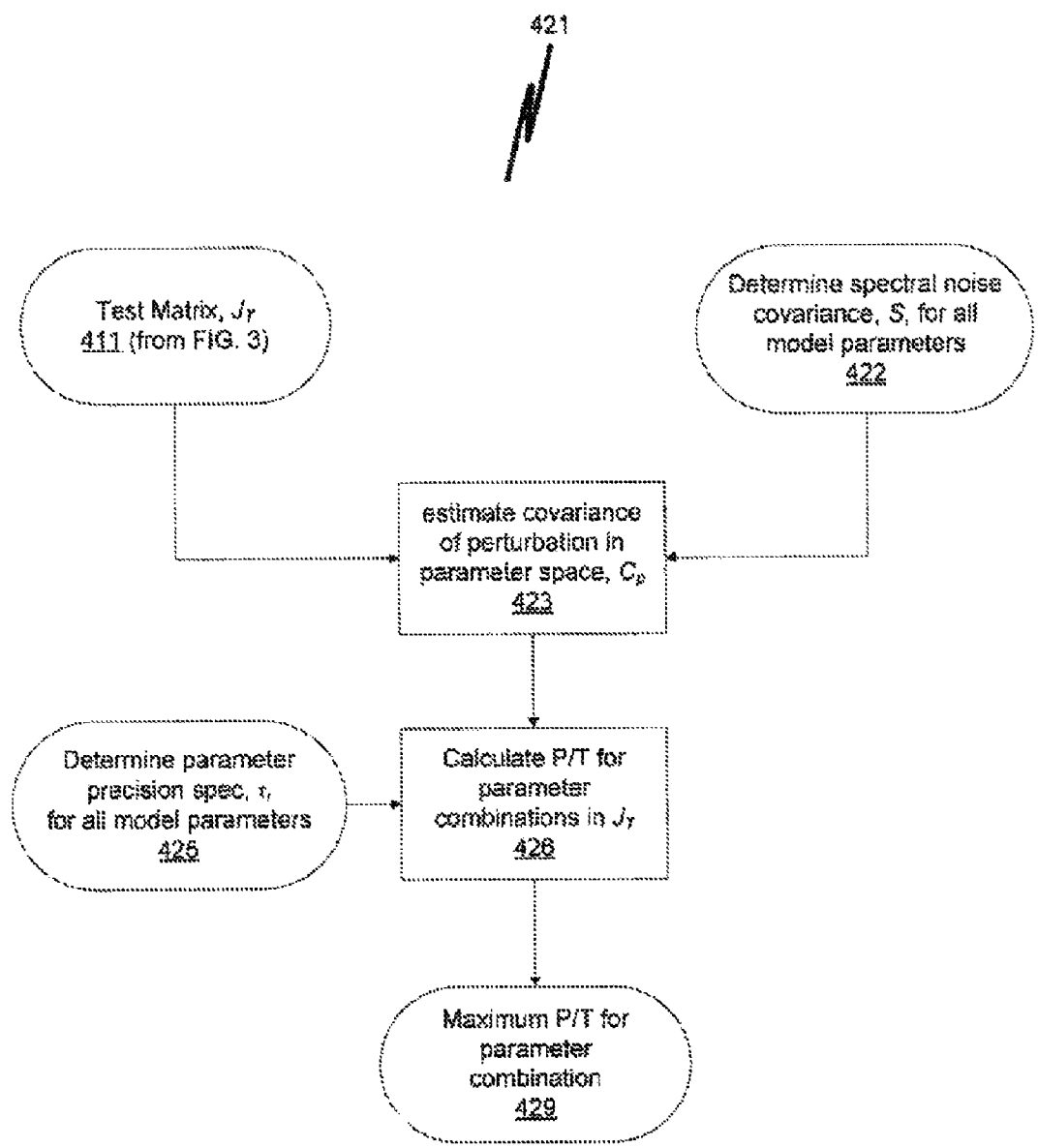
FIG. 4B is a flow diagram illustrating an exemplary method for determining a precision metric from the Jacobian of measured spectral information, in accordance with an embodiment.

The relative precision metrics calculated correspond to the columns that are included in the test matrix, $J_T$. FIG. 4B is a flow diagram illustrating an exemplary method 421 for determining a precision metric for each parameter from a Jacobian matrix, such as the test matrix $J_T$ which was assembled at operation 411. The method begins with a determination of spectral noise covariance, S, for all N model parameters, at operation 422. The model parameters are estimated by comparing the measured spectral information and simulated spectral information computed by a model, using a quadratic norm:

$$\chi^2 = \frac{1}{N_{\text{eff}}}(f-m)^T Q(f-m). \quad (1)$$

Here f is a vector containing the simulated spectral information and m represents the measurements, and $N_{\text{eff}}$ is approximately the length of the vector f. For the scatterometry measurements, the vector f typically consists of the variables $\alpha(\lambda)$ and $\beta(\lambda)$ alternating down the column with the shorter wavelengths in the leading position.

$$m=[\alpha_1\beta_1 \ldots \alpha_N\beta_N]^T \quad (2)$$

The measurement, m, is presumed to be perturbed by zero mean, Gaussian, white noise $$m=m_0+v$$

with covariance $$S=E[vv^T]. \quad (3)$$

The vector f containing the simulated spectral information can be, for the purpose of analysis, described by a first order approximation.

$$f=f_0+Jp \quad (4)$$

where $f_0$ is the spectral information that minimizes the $\chi^2$ norm, $J=\nabla_x f(x_0)$ is the Jacobian matrix evaluated at the minimizer in parameter space $x_0$, and where $p=x-x_0$ is a perturbation from the minimizer. We can further write, without loss of generality that $$f_0=m_0+\mu \quad (5)$$

where μ is a bias vector which takes into account any mismatches in the modeling of the measured spectral information by the model. Rewriting the $\chi^2$ norm (1) in terms of this perturbational model, we have $$\chi^2 = \frac{1}{N_{\text{eff}}}(\mu+Jp-v)^T Q(\mu+Jp-v) \quad (6)$$

To determine the effect of the spectral noise, v, on the parameter perturbation, p, we note that the necessary condition for minimizing the $\chi^2$ norm is that its derivative with respect to p is zero, i.e., $\partial\chi^2/\partial_p=0$. This implies $$J^T QJp=J^T Q(v-\mu) \quad (7)$$

At operation 423, the covariance of the perturbation in parameter space, p, can then be estimated as $$C_p = E[pp^T] \quad (8)$$
$$= (J^T QJ)^{-1} J^T QE[vv^T]QJ(J^T QJ)^{-1}$$
$$= (J^T QJ)^{-1} J^T QSQJ(J^T QJ)^{-1}$$

Once the covariance has been estimated using equation (8), the precision (1σ) vector, h, can be determined for the test matrix by evaluating the square root of the diagonal of the covariance matrix:

$$h_i=\sqrt{[C_p]_{ii}} \quad (9a)$$

In a further embodiment, in addition to the precisions, correlation coefficients are also computed from the covariance matrix. Let us define the correlation matrix as:

$$R_p = D_p C_p D_p \quad (9b)$$

where $$[D_p]_{ij} = \begin{cases} 1/h_i; & i=j \\ 0; & i \neq j \end{cases} \quad (9b)$$

The correlation coefficients between the ith and jth parameter are the i, jth entry in $R_p$.

Note that there is a one-to-one correspondence between the columns of the test matrix and the size of the covariance matrix, and that the order of the columns is the order of the precision vector h. With equation (9) and the process variation or tolerance associated with each parameter input at operation 425, the relative precision as a function of hardware precision and process variation may be determined as exemplified in FIG. 2B. Depending on the form of the relative precision function, an extremum of the relative precision metric is generated for comparing (ranking) combinations as a way of determining which parameter combinations are good to float in concert, and which are not. For the exemplary embodiment where the relative precision metric takes the form of a P/T ratio at operation 426, a maximum of the ratio of the standard deviation of the $i^{th}$ parameter, $\sigma_i$, to the process variation, $\tau_i$, $$\left(\max_i \left\{\frac{\sigma_i}{\tau_i}\right\}\right)$$

is output at operation 429. Such a maximum represents the P/T of a parameter in a given parameter combination which will be nearest to a P/T used as an endpoint threshold, as further discussed elsewhere herein. In a further embodiment, a measure of the correlation of the parameters is defined as simply, $$r_p = \max_{i,j;i \neq j} ([R_p]_{ij}) \qquad (9c)$$

This can be used in conjunction with the P/T ratio defined above, i.e., $$\max\left\{\max_i\left\{\frac{\sigma_i}{\tau_i}\right\}, \frac{r_p}{\tau_R}\right\} \qquad (9d)$$

where $\tau_R < 1$ is a threshold set as a limit on the maximum desired correlation coefficient.

Returning to FIG. 4A, with the ability to determine the maximum P/T for each combination in the test matrix $J_T$, the method 410 proceeds to identify the combination that satisfies a threshold P/T value (e.g., 1 as depicted in FIG. 2B) and contains the greatest number of parameter columns. The identified combination of parameters are to be floated parameters, M, in a revised scatterometry model with a determination at operation 435 of a corresponding set of model parameters, N-M, that are to be fixed to a predetermined value (e.g., such as a nominal value provided in the initial model). The method 410 then returns to operation 340 (FIG. 3).

Figure 5:
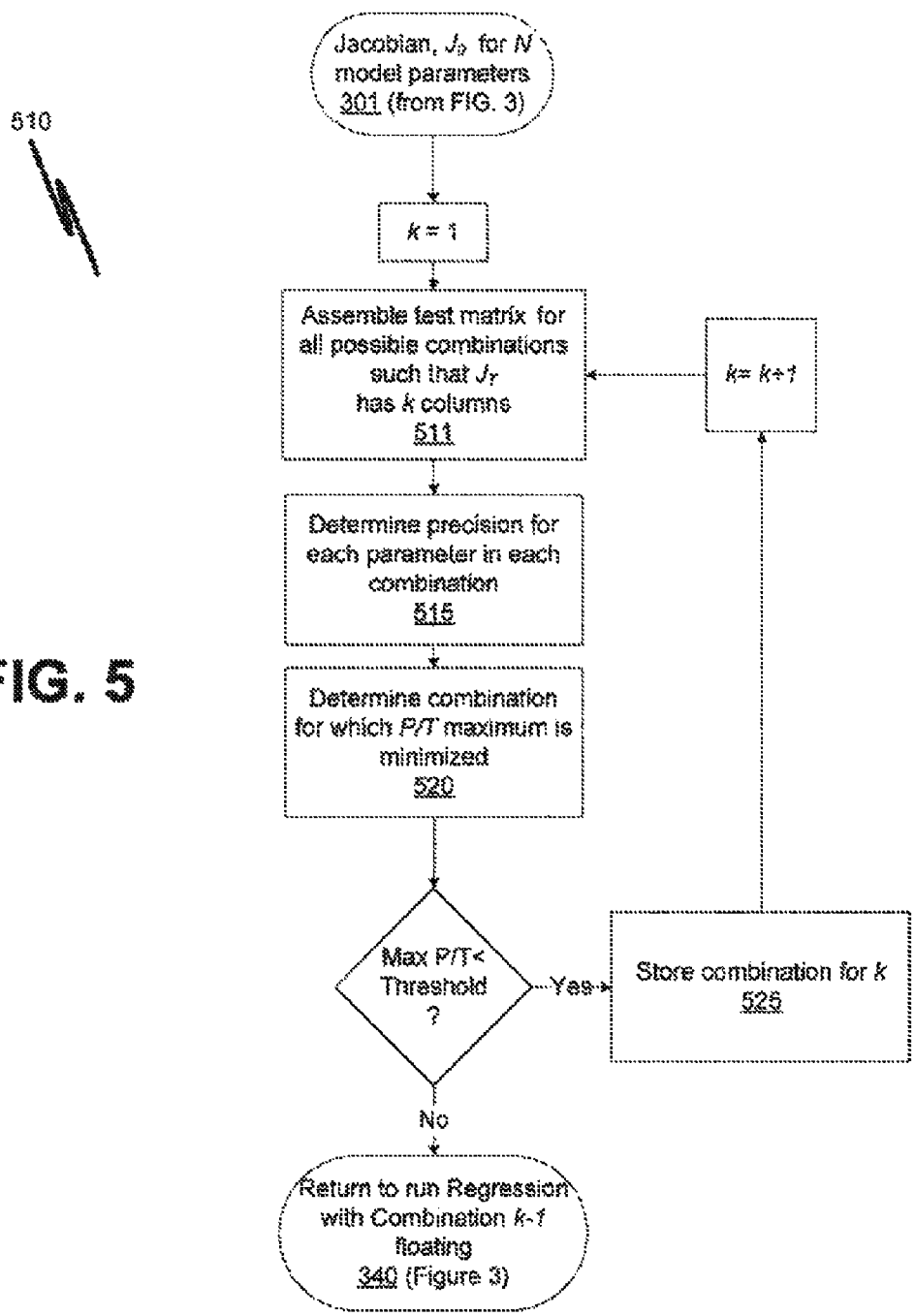
FIG. 5 is a flow diagram illustrating an exemplary combinatoric method for determining a fixed model parameter set based on a precision metric derived from the Jacobian of measured spectral information, in accordance with an embodiment.

Depending on the implementation, computation time for the method 410 may vary greatly. For example, FIGS. 5, 6 and 7 illustrate three particular implementations of test matrix generation, precision computation, and parameter combination identification more generally described in the context of FIG. 4A. In the first implementation depicted in FIG. 5, a combinatoric search is performed for the combination having the largest number of parameters and requires a factorial computation time with respect to number of parameters. The two implementations illustrated in FIGS. 6 and 7 perform an ordered search and have the advantage of linear computation time with respect to number of parameters.

FIG. 5 is a flow diagram illustrating an exemplary combinatoric method 510 for determining the largest number of floatable parameters such that the P/T ratio of the combination is kept below a threshold (e.g., 1 as depicted in FIG. 2B) to ensure a good set of floatable parameters. This embodiment begins at operation 511 with $J_0$ computed from operation 301, let the number of all possible floatable parameters, i.e., the number of columns in $J_0$, be N and initialize the iterator value: k=1. The process tolerance $\tau_i$ is also determined for all the parameters (e.g., via default settings or user defined settings), as is the spectral noise covariance, S, using techniques previously described.

At operation 511 the test matrix (Jacobian) $J_T$ is assembled by taking all of the possible combinations of columns from $J_0$ such that $J_T$ has k columns. (There are $$\binom{N}{k}$$

such combinations.) Next, at operation 515, the precisions for the parameters in each combination are determined using equations (8) and (9). At operation 520, the max P/T ranking metric is determined for each combination and the combination for which the max P/T is minimized is identified. If the identified combination has a max P/T less than the P/T threshold (e.g., 1), that combination is stored to memory at operation 525. The iterator value is then incremented k=k+1, and the combinatoric method 510 iterates back to operation 511 to assemble another test matrix comprising all possible combinations (e.g., for k=2). If however, the combination identified at operation 520 has an associated metric greater than the P/T threshold, the method 510 ends by returning the combination recorded at operation 525 for k−1 as the parameters which are to be floated during a subsequent regression at operation 340 (FIG. 3).

For many scatterometry applications, the number of combinations of floatable parameters is manageable with the combinatoric method 510. However, when the number of floatable parameters exceeds about 20, then it is advantageous to successively identify individual parameters which will be always floated ($M_{FLOAT}$) and/or will always fixed ($M_{FIX}$). These parameters are computed by the "bottom up" and "top-down" methods, respectively. Both these processes produce an ordered list. In the bottom up algorithm, the list suggests which order to float the parameters and for the top-down algorithm, the list suggests in which order to fix the parameters.

Figures 6A, 6B:
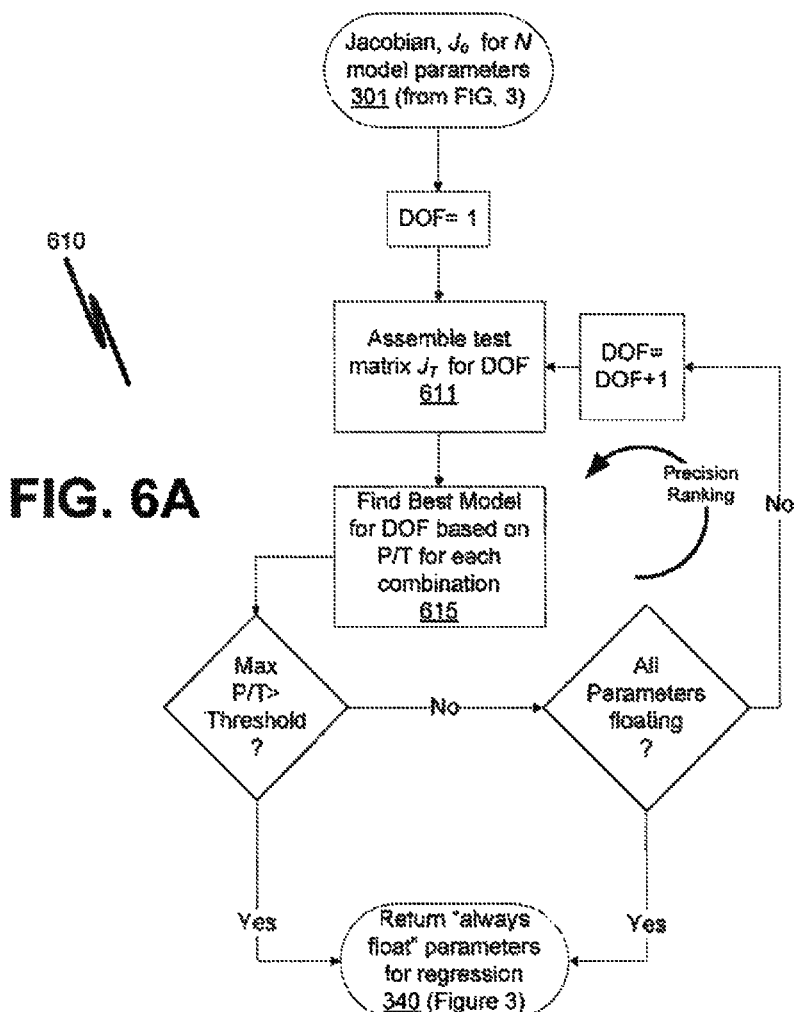
FIG. 6A is a flow diagram illustrating an exemplary bottom-up method for determining a fixed model parameter set based on a precision metric derived from the Jacobian of measured spectral information, in accordance with an embodiment.
FIG. 6B depicts an exemplary output as the bottom-up method illustrated in FIG. 6A is executed by the model pre-processor in FIG. 2B, in accordance with an embodiment.
Figure 7:
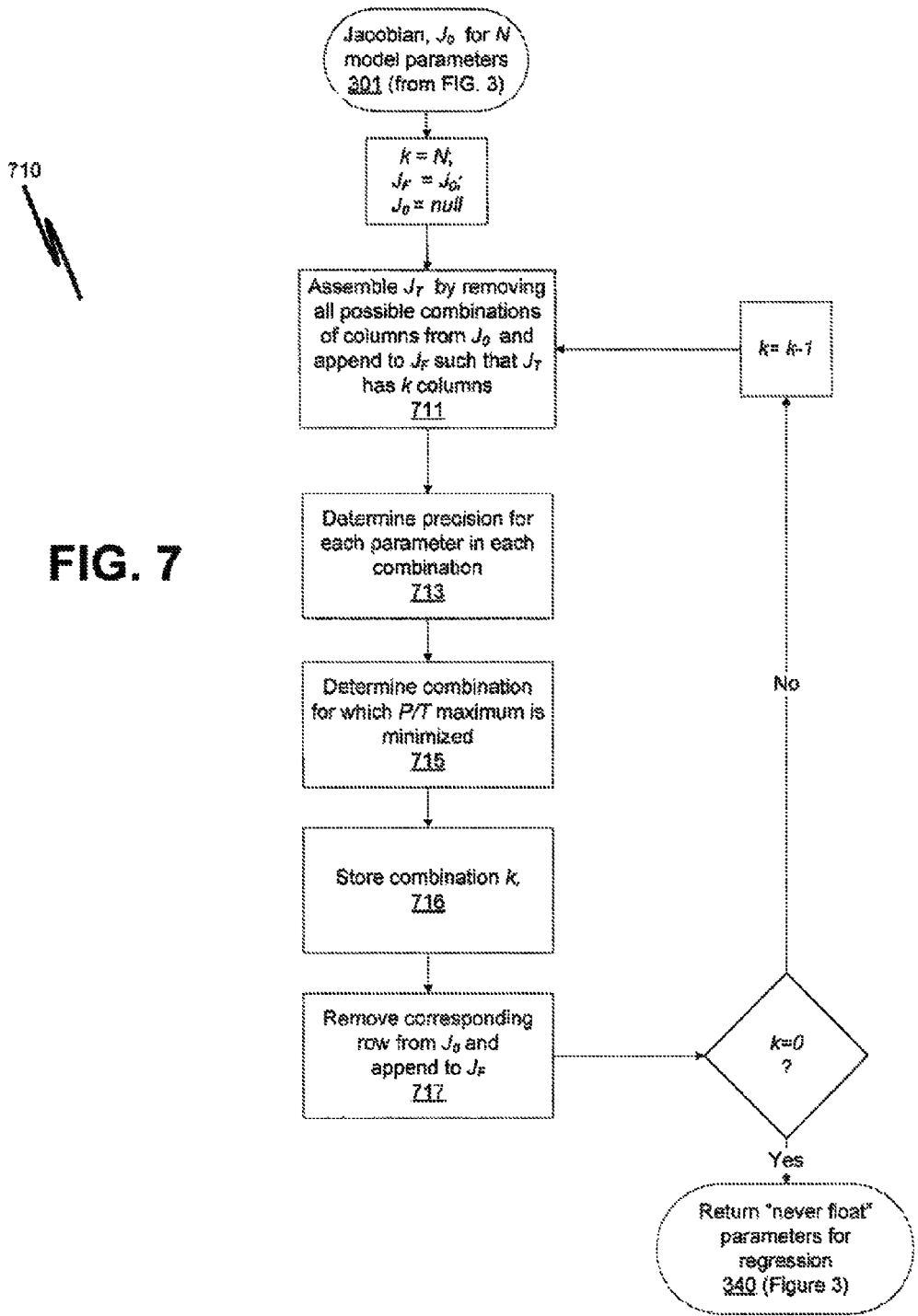
FIG. 7 is a flow diagram illustrating an exemplary top-down method for determining a fixed model parameter set based on a precision metric derived from the Jacobian of measured spectral information, in accordance with an embodiment.

FIG. 6A is a flow diagram illustrating an exemplary bottom-up method 610 for determining a fixed parameter set based on a precision metric derived from the Jacobian of measured spectral information, in accordance with an embodiment. The method 610 begins with the DOF=1 and $\tau_i$ determined for all the parameters N in the input Jacobian $J_0$. The spectral noise covariance, S, is determined and a buffer matrix $J_F$ is set to the null set. At operation 611, the test Jacobian, $J_T$ is assembled by taking all of the possible combinations of columns from $J_0$ and appending it to $J_F$ such that $J_T$ has DOF columns (there are $$\binom{N}{DOF}$$

such combinations).

At operation 615, the best model for the DOF is determined by identifying the parameter combinations that should be floated for the DOF based on the max P/T for each combination. This determination is substantially as previously described for the combinatoric method 510, including a computation of the precisions and/or correlation coefficients for the parameters in each combination using equations (8) and (9a-9c). A determination of the combination for which the maximum (worst) P/T is minimized (i.e., the best combination of floatable parameters based on the parameters in the combination having the worst P/T). That combination is recorded along with the associated DOF, and the corresponding row is removed from $J_0$ and appended into $J_F$. In this manner, the test matrix $J_T$ in a successive iteration retains the parameters floated in the immediately preceding iteration to capture parameter correlation effects for both the floated parameter(s) and the subsequent combinations of parameters that will be assembled from the $J_0$ that now has a reduced parameter set (N-DOF).

If either the max P/T of the current iteration is greater than the P/T threshold (e.g., between 0.2-0.5) or if all parameters N have been identified to float, then the method 610 ends by returning the always float parameters, $M_{FLOAT}$, stored in the matrix $J_F$ for regression of a revised model, as further described for operation 340 (FIG. 3). If however, the max P/T of the current iteration remains less than the P/T threshold and not all parameters N have been identified to float, then another iteration is performed with the DOF incremented to DOF+1.

FIG. 6B depicts an exemplary output as the bottom-up method 610 is executed (e.g., by the model preprocessor in FIG. 2B), in accordance with an embodiment. As shown, for each successive iteration (1 DOF-4 DOF), 30 parameter combinations are assembled from an input Jacobian $J_0$ for which N is 30. As such, the processing time for each successive iteration remains a linear function of the number of model parameters N. An ordered list comprising 615A, 615B, 615C, and 615D is generated over four successive iterations. In the first iteration (1 DOF) 30 different combinations, each having one parameter floating, are assembled into the test matrix, $J_T$. As shown, the parameter "1," with the lowest relative precision metric, is identified as floating and appended to each combination in the next successive iteration (2 DOF). With the parameter "1" removed from $J_0$, 30 more combinations having one additional degree of freedom than the immediately preceding iteration are assembled into the next test matrix $J_T$ iteration. A new P/T calculation is performed for the 2 DOF iteration which takes into account correlation between the parameter "1" and each of the other parameters in the 30 combinations. As shown, the parameter "1, 3" combination 615B is identified as having the lowest maximum P/T value, rather than the combination "1, 2." As such, the rankings of a test matrix are non-deterministic for at least the reason of parameter correlation. Thus, correlation between the parameter "1" and parameter "2," which were ranked as having the first and second lowest P/T values in the previous iteration, caused an increase in one or more the their P/T values when both were floated together in the 2 DOF iteration. After the further iteration, the combination 615D is determined to have the lowest maximum P/T value, however the bottom-up method 610 is ended with at least one of the parameters 1, 3, 4, or 6 having a P/T greater than the threshold P/T value and therefore no further parameters, M, are to be added to the "float" parameter set.

FIG. 7 is a flow diagram illustrating an exemplary top-down method 710 for determining a fixed parameter set based on a precision metric derived from the Jacobian of measured spectral information, in accordance with an embodiment. The method 710 begins with the Jacobian $J_0$ input from operation 301 (FIG. 3), k=N, $J_F=J_0$ and $J_0$ is set to the null set. $\tau_i$ is determined for all the parameters N and the spectral noise covariance, S is also determined as previously described. At operation 711, the test matrix (Jacobian), $J_T$ is assembled by removing all of the possible combinations of columns from $J_0$ one at a time and appending it to $J_F$ such that $J_T$ has k columns (there are $$\binom{N}{N-k}$$

such combinations). At operation 713, the precisions and/or correlation coefficients for the parameters in each combination are determined using equations (8) and (9a-9c). At operation 715, the combination for which the maximum P/T is minimized is identified and stored at operation 716. The corresponding row is removed from $J_0$ and appended to $J_F$ at operation 717. If k is not 0, then k is decremented to k−1 and a subsequent iteration begins with assembly of another test matrix, $J_T$. The method 710 ends if k=0, and an ordered list of "never float parameters" (e.g., $M_{FIX}$) is returned to operation 340 for regression (FIG. 3).

With the fixed parameter set determined by any of the methods 410, 510, 610, 710, the preprocessing method 300 (returning to FIG. 3) revises the parameterized scatterometry model to have the reduced set of N−$M_{FIX}$ floating parameters. In one such embodiment, those parameters which are determined to be fixed at operation 310 are set to predetermined nominal values. At operation 340, a regression is then run on the measured spectral information using the nominals and ranges provided with the initial model. In the exemplary embodiment depicted if FIG. 3, the regression output is then utilized to perform, at operation 345, a verification of at least some of the parameters which were fixed in operation 310.

Figure 8:
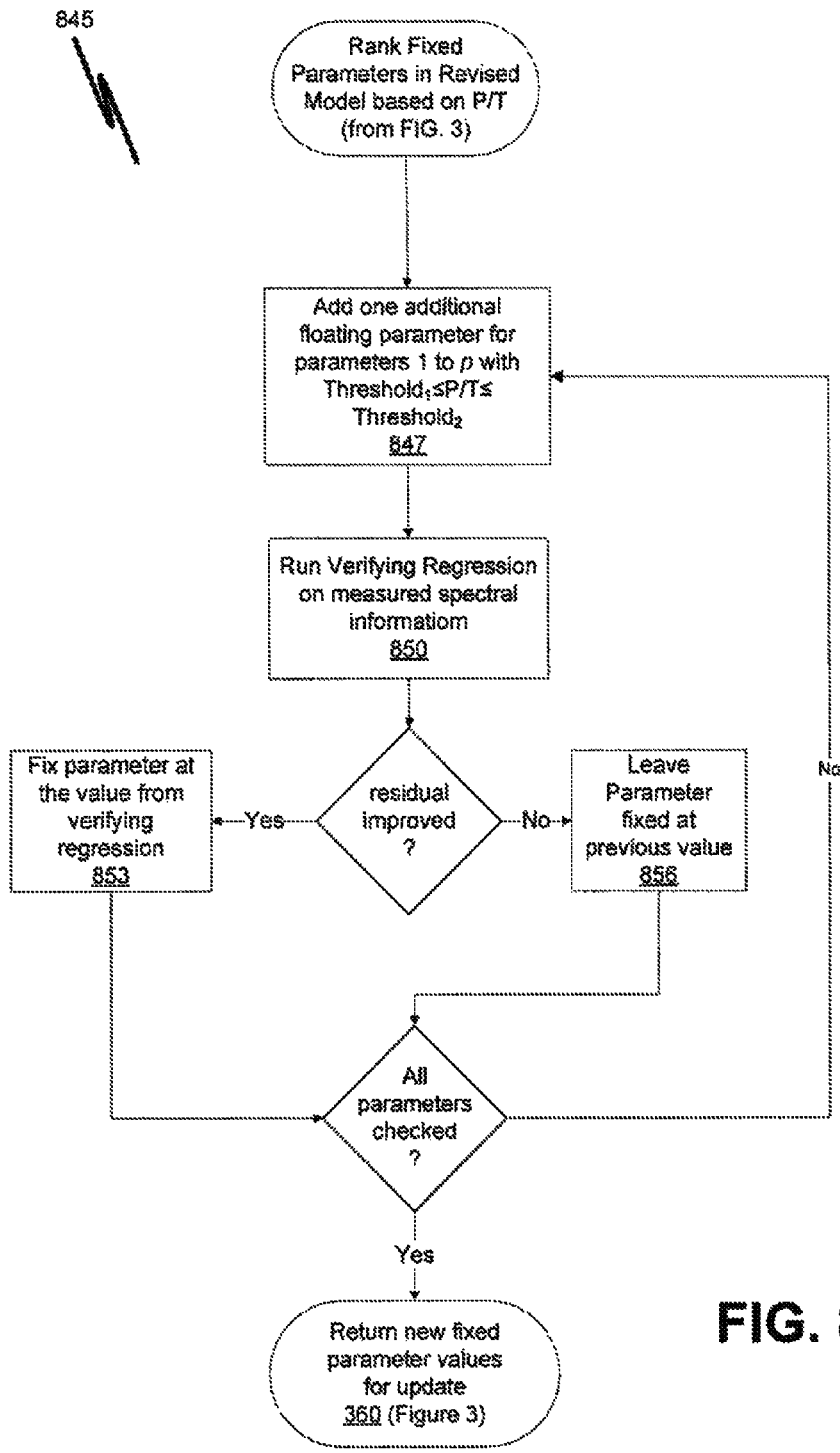
FIG. 8 is a flow diagram illustrating an exemplary fixed model parameter verification method, in accordance with an embodiment.

FIG. 8 is a flow diagram illustrating an exemplary fixed parameter verification method 845, in accordance with one embodiment. Generally, the fixed parameter verification optimizes the values of parameters that have a sufficiently high P/T that they cannot be floated in a final model if the nominal value is different enough from a regressed value that it significantly impacts the fitting. The method 845 begins with ranking the fixed parameters according to their relative precision metric (e.g., P/T). As such, correlation with the M floating parameters is taken into account. In one embodiment, all fixed parameters are verified by the method 845. In the exemplary embodiment however, a configurable fixed parameter verification threshold is applied to the ranking and only the subset of fixed parameters having a sufficiently small relative precision (e.g., P/T<2) is processed through the verification method 845.

At operation 847, the revised model is modified to have those fixed parameters 1 through p which have a relative precision falling within a P/T range successively converted, on an individual basis, into an additional floating parameter. For example, those parameters 1-p having a P/T value between a lower threshold (e.g., 0.3) and an upper threshold (e.g., 2.0) are floated one at a time, preferably in order of increasing P/T. For each successive parameter floated, a verifying regression is run on the measured spectral information at operation 850. The starting point for this local regression should be the final answer for the previous regression. A determination is then made whether the verifying regression is improved relative to that of the immediately preceding regression (e.g., regression 340 or previous parameter iteration of the fixed parameter verification method 845). For example, in response to a residual or $\chi^2$ being improved by an amount greater than a configurable "improvement threshold" (e.g., residual of 0.05 better than the previous model revision) the method 845 proceeds to operation 853. At operation 853, the parameter floated in the current iteration which was formally fixed to a previous value (e.g., nominal initial value) is updated to take a revised value determined from the verifying regression. In response to an insufficiently improved residual however, the parameter floated in the current iteration is left at the previous value to which it was fixed (e.g., nominal initial value). The method 845 iterates the verifying regression operation 850 and improvement check until all qualifying fixed parameters are verified. The method 845 then returns the new fixed parameter values for updating the revised model at operation 360 (FIG. 3).

Returning to FIG. 3, in an embodiment a spectral fit filter is included in the loop of the preprocessing method 300. In the exemplary embodiment, the normalized goodness of fit (NGOF) is determined for the revised model having updated parameter values. A corrective action, such as output of an error message at operation 370 to a user of the optical metrology system (e.g., "verify nominal model, n, k, or measured spectral information"), is performed in response to the NGOF value being below a NGOF threshold (e.g., 0.98). In response a sufficiently high NGOF, the model preprocessing method 300 proceeds to determine the significance of the revision in the model from the previous model (e.g., comparison of the revised model and the initial model). This determination is useful given that the decisions to fix and/or float parameters were based on a parameter precision metric determined from the Jacobian of the previous model. As the derivative of a function is dependent on the position within that function, a significantly changed model may reposition the model to a different parameter space which could impact the selection of what parameters are fixed vs. floated.

Figure 9:
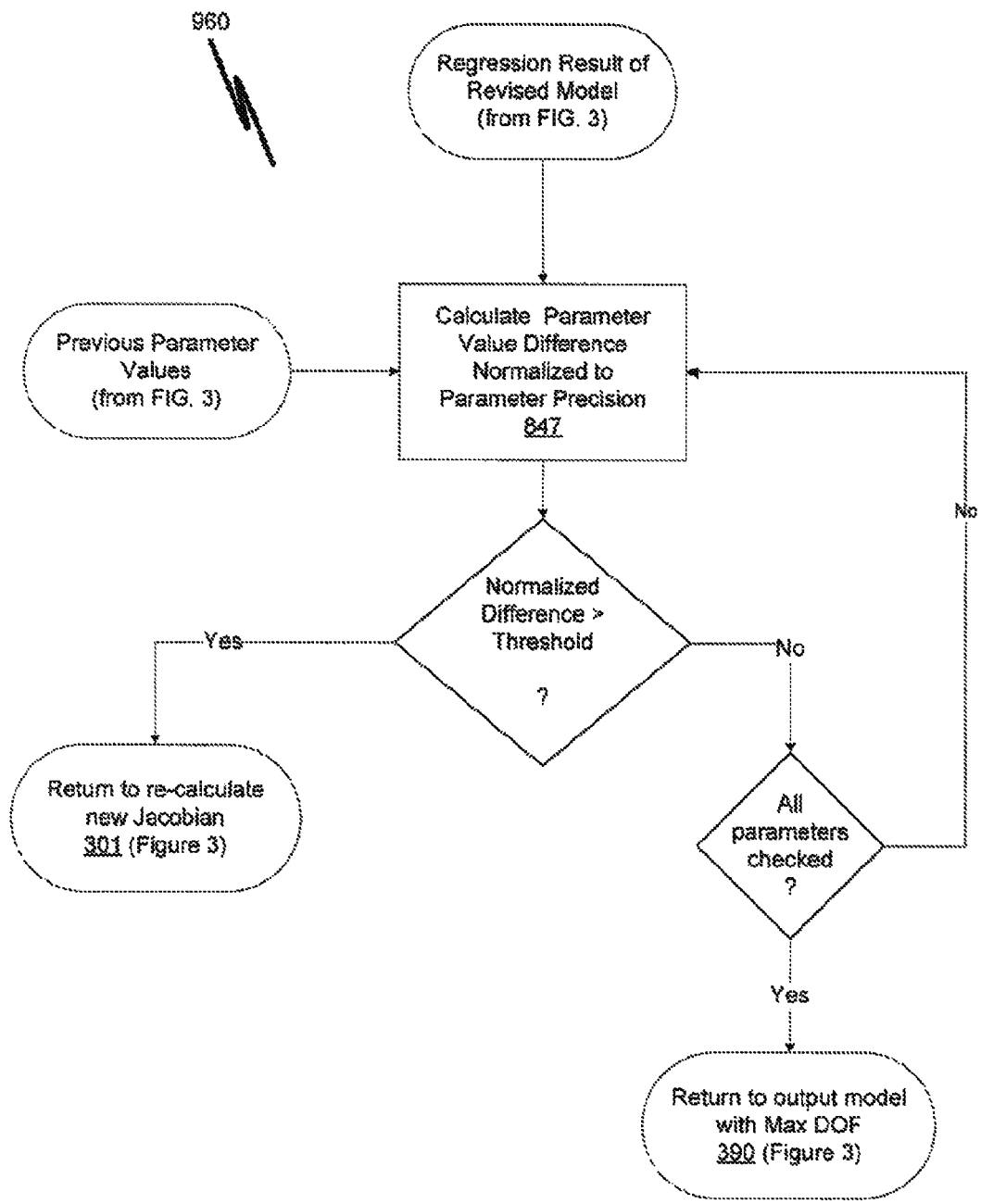
FIG. 9 is a flow diagram illustrating an exemplary method for determining whether a re-calculation of the Jacobian based on a new point in parameter space should be performed, in accordance with an embodiment.

FIG. 9 is a flow diagram illustrating an exemplary method for determining whether a re-calculation of the Jacobian based on a new location in parameter space should be performed, in accordance with an embodiment. Beginning with the regression result of the revised model from operation 360 (FIG. 3), a normalized parameter value difference is calculated for each of the parameters of the model. The difference is generated between the previous parameter values (e.g., nominal values, min/max of initial model) and the values in the revised model. These values are then normalized by the estimated hardware precision, P, for that parameter, thereby comparing the magnitude of the repositioning in parameter space to the sensitivity to such a repositioning.

If the normalized difference is not greater than a configurable difference threshold, the method 960 iterates to the next parameter until all parameters are checked. With all parameters determined to have normalized differences below the threshold, the method 960 returns to operation 390 of FIG. 3. In the event that the normalized difference is greater than a configurable threshold value for a first parameter, the method 960 returns to operation 301 (FIG. 3) to re-calculate the Jacobian $J_0$ using the revised model.

Returning to FIG. 3, if a subsequent iteration of the preprocessing method 300 is to be performed the method proceeds from operation 301 to operation 310 again to determine a new set of fixed parameters based on the re-calculated Jacobian (e.g., re-started from a 1 DOF model), etc., substantially as previously described herein. A loop escape condition may be set to 3-5 or more iterations. Where no further iterations of the preprocessing method 300 are needed, the method 300 is ended with the maximum DOF model identified at operation 390.

Returning to FIG. 2A, the maximum DOF model is then refined at operation 204 using regression techniques to minimize a best error estimate of the parameters deemed critical either by default or user definition. Critical parameters may generally include feature CD or SWA. For refinement operation 204, additional sources of error may be combined with the hardware precision (P) to arrive at a total estimated error (TEE) to be minimized in the final model.

The present invention also relates to an apparatus for performing the operations herein, such as the model optimizer 212. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, the present invention is not described with reference to any particular programming language. It will be appreciated that a variety of programming languages may be used to implement the teachings of the invention as described herein.

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

Figure 10:
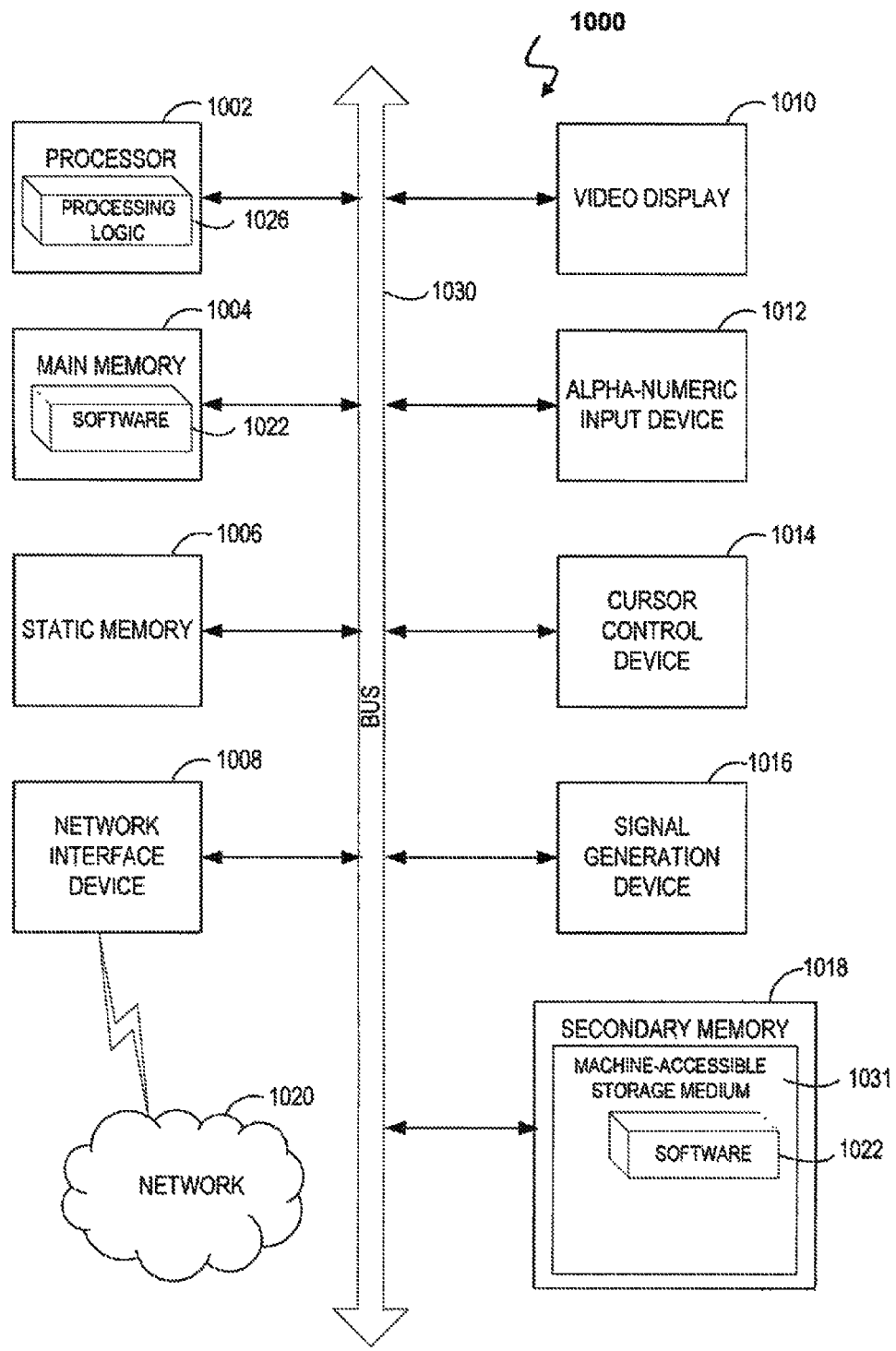
FIG. 10 illustrates a block diagram of an exemplary computer system, in accordance with an embodiment.

FIG. 10 illustrates a diagrammatic representation of a machine in the exemplary form of a computer system 1000 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like.

Processor 1002 is configured to execute the processing logic 1026 for performing the operations and steps discussed herein.

The computer system 1000 may further include a network interface device 1008. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1031 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

The machine-accessible storage medium 1031 may also be used to store or train a neural network, and/or a software library containing methods that train or call a neural network meta-model and/or a user interface of the neural network meta-model. The machine-accessible storage medium 1031 may further be used to store one or more additional components. While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Figure 11:
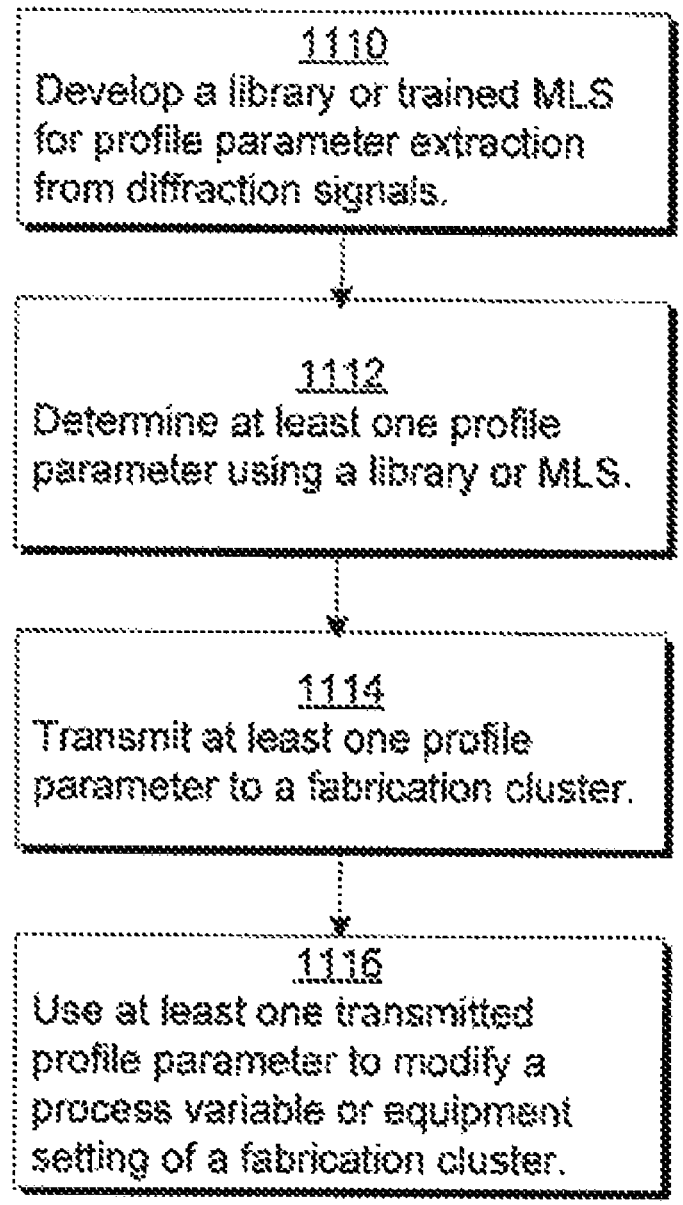
FIG. 11 is a flow diagram illustrating an exemplary method for determining and utilizing profile parameters for automated process and equipment control, in accordance with one embodiment.

FIG. 11 is an exemplary flowchart for determining and utilizing profile parameters for automated process and equipment control. In step 1110, a library and/or trained machine learning systems (MLS) are developed to extract profile parameters from the measured diffraction signals. In step 1112, at least one profile parameter of a structure is determined using the library or the trained MLS. In step 1114, the at least one profile parameter is transmitted to a fabrication cluster configured to perform a processing step, where the processing step may be executed in the semiconductor manufacturing process flow either before or after measurement step 1112 is made. In step 1116, the at least one transmitted profile parameter is used to modify a process variable or equipment setting for the processing step performed by the fabrication cluster.

Figure 12:
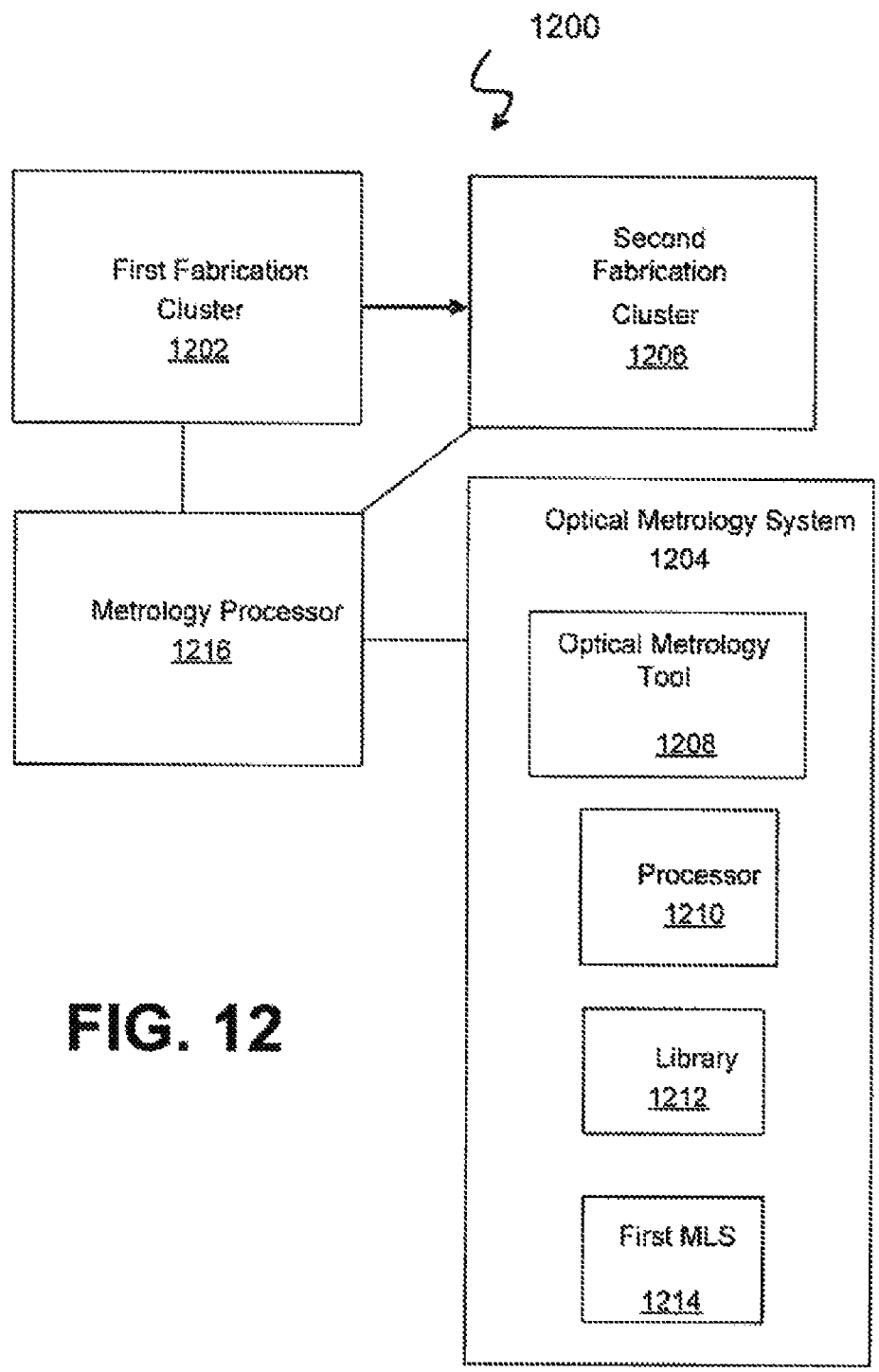
FIG. 12 is a block diagram illustrating select elements of a system according to an embodiment for determining and utilizing profile parameters for automated process and equipment control.

FIG. 12 is an exemplary block diagram of a system for determining and utilizing profile parameters for automated process and equipment control. System 1200 includes a first fabrication cluster 1202 and optical metrology system 1204. System 1200 also includes a second fabrication cluster 1206. Although the second fabrication cluster 1206 is depicted in FIG. 12 as being subsequent to first fabrication cluster 1202, it should be recognized that second fabrication cluster 1206 can be located prior to first fabrication cluster 1202 in system 1200 (e.g. and in the manufacturing process flow).

A photolithographic process, such as exposing and/or developing a photoresist layer applied to a wafer, can be performed using first fabrication cluster 1202. In one exemplary embodiment, optical metrology system 1204 includes an optical metrology tool 1208 and processor 1210. Optical metrology tool 1208 is configured to measure a diffraction signal off of the structure. If the measured diffraction signal and the simulated diffraction signal match, one or more values of the profile parameters are presumed equal the one or more values of the profile parameters associated with the simulated diffraction signal.

In one exemplary embodiment, optical metrology system 1204 can also include a library 1212 with a plurality of simulated (i.e. calculated) diffraction signals and a plurality of values of one or more profile parameters associated with the plurality of simulated diffraction signals. As described above, the library can be generated in advance; metrology processor 1210 can compare a measured diffraction signal of a structure to the plurality of simulated diffraction signals in the library. When a matching simulated diffraction signal is found, the one or more values of the profile parameters associated with the matching simulated diffraction signal in the library is assumed to be the one or more values of the profile parameters used in the wafer application to fabricate the structure.

System 1200 also includes a metrology processor 1216. In one exemplary embodiment, processor 1210 can transmit the one or more values of the one or more profile parameters to metrology processor 1216. Metrology processor 1216 can then adjust one or more process parameters or equipment settings of first fabrication cluster 1202 based on the one or more values of the one or more profile parameters determined using optical metrology system 1204. Metrology processor 1216 can also adjust one or more process parameters or equipment settings of the second fabrication cluster 1206 based on the one or more values of the one or more profile parameters determined using optical metrology system 1204. As noted above, fabrication cluster 1206 can process the wafer before or after fabrication cluster 1202. In another exemplary embodiment, processor 1210 is configured to train machine learning system 1214 using the set of measured diffraction signals as inputs to machine learning system 1114 and profile parameters as the expected outputs of machine learning system 1214.

It is to be understood that the above description is intended to be illustrative, and not restrictive. Many other embodiments will be apparent to those of skill in the art upon reading and understanding the above description. Although the present invention has been described with reference to particularly artful embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method for evaluating a diffracting structure, the method comprising:
receiving measured spectral information for the diffracting structure;
receiving a scatterometry model for the diffracting structure, the scatterometry model having a plurality of model parameters (N);

computing a Jacobian matrix of the measured spectral information, the Jacobian matrix containing a column for each of the plurality of model parameters;
computing a test matrix including a plurality of combinations of parameter columns derived from the Jacobian matrix;
computing a relative precision metric for each of the parameter columns in the plurality of combinations, wherein the relative precision metric is a function of hardware precision for the parameter column and expected process variation for the parameter column;
associating, for each of the plurality of combinations, a maximum of the computed relative precision metrics with the corresponding combination;
identifying one of the plurality of combinations having an associated maximum relative precision metric which is less than a threshold value, and which includes the greatest number of parameter columns, wherein parameters in the identified combination are to be floated in a revised scatterometry model;
running a regression on the measured spectral information with the revised scatterometry model with the parameters floated to generate simulated spectral information; and
determining a physical characteristic of the diffracting structure based on the simulated spectral information.

2. The method as in claim 1, wherein computing the relative precision metric for each of the parameter columns further comprises:
determining a spectral noise covariance (S) for all model parameters;
determining, from S, a covariance of a perturbation ($C_p$) in the parameter space of the test matrix; and
determining the relative precision metric by dividing the hardware precision, by the expected process variation for that parameter, wherein the hardware precision is the square root of the diagonal of $C_p$.

3. The method as in claim 1, wherein:
generating the test matrix further comprises:
iteratively assembling the test matrix, wherein for each successive iteration, N combinations of columns having one additional floating parameter than the previous test matrix iteration are copied from the Jacobian matrix and appended to all parameter combinations having the lowest relative precision metric determined from previous iterations; and
wherein identifying one of the plurality of combinations further comprises:
floating the parameter combination having the lowest relative precision metric when combined with parameters set to float in previous iterations;
terminating the iterative test matrix assembly in response to a maximum relative precision of the floated parameters reaching a threshold; and
identifying as the set of parameters to fix, a set of the model parameters excluded from the combination floated in the last test matrix assembly iteration.

4. The method as in claim 1, wherein generating the test matrix further comprises:
adding to the test matrix all possible combinations of columns from the Jacobian matrix;
iteratively reducing the test matrix, wherein for each successive iteration, combinations of columns having the highest relative precision metric and one fewer floating parameter than the previous test matrix iteration are retained; and
wherein identifying one of the plurality of combinations further comprises:
floating the parameter combination having the lowest associated maximum relative precision metric when combined with parameters set to float in previous iterations;
terminating the iterative test matrix assembly in response to a maximum relative precision of the floated parameters reaching a threshold; and
identifying as the set of parameters to fix, a set of the model parameters excluded from the combination floated in the last test matrix assembly iteration.

5. The method as in claim 1, wherein generating the test matrix comprises generating a plurality of test matrices, each of the plurality including all possible combinations of the N parameters.

6. The method as in claim 1, further comprising:
successively floating each parameter in a subset of fixed parameters, the fixed parameters excluded from a set corresponding to the parameter columns of the identified combination, the subset containing parameters having the relative precision metric within a threshold range;
running a verifying regression after each additional parameter is floated; and
fixing the additional parameter at a new fixed parameter value in response to an improvement in a residual of the verifying regression, the new fixed parameter value determined from the verifying regression.

7. The method as in claim 6, further comprising:
determining a difference between the predetermined parameter value and the new fixed parameter value;
normalizing the difference to the parameter's precision metric; and
re-computing a Jacobian matrix of the measured spectral information using the revised scatterometry model and new fixed parameter value in response to the normalized difference being greater than a threshold.

8. The method as in claim 7, further comprising:
identifying, based on a precision metric determined from the recomputed Jacobian matrix for each model parameter in a plurality of parameter combinations, a set of model parameters for which each parameter of the set of model parameters is to be fixed to a predetermined parameter value in a newly revised scatterometry model; and
running a regression on the measured spectral information with the newly revised scatterometry model to generate newly simulated spectral information.

9. The method as in claim 1, wherein the measured spectral information characterizes a grating formed on a semiconductor wafer.

10. A non-transitory machine-accessible storage medium having instructions stored thereon which cause a data processing system to perform a method for evaluating a diffracting structure, the method comprising:
receiving measured spectral information for the diffracting structure;
receiving a scatterometry model for the diffracting structure, the scatterometry model having a plurality of model parameters (N);
computing a Jacobian matrix of the measured spectral information, the Jacobian matrix containing a column for each of the plurality of model parameters;
computing a test matrix including a plurality of combinations of parameter columns derived from the Jacobian matrix;

computing a relative precision metric for each of the parameter columns in the plurality of combinations, wherein the relative precision metric is a function of hardware precision for the parameter column and expected process variation for the parameter column;

associating, for each of the plurality of combinations, a maximum of the computed relative precision metrics with the corresponding combination;

identifying one of the plurality of combinations having an associated maximum relative precision metric which is less than a threshold value, and which includes the greatest number of parameter columns, wherein parameters in the identified combination are to be floated in a revised scatterometry model;

running a regression on the measured spectral information with the revised scatterometry model to generate a simulated spectral information; and determining a physical characteristic of the diffracting structure based on the simulated spectral information.

11. The non-transitory machine-accessible storage medium as in claim 10, wherein the instructions for computing the relative precision metric for each of the parameter columns further comprise instructions for:

determining a spectral noise covariance (S) for all model parameters;

determining, from S, a covariance of a perturbation ($C_p$) in the parameter space of the test matrix; and determining the relative precision metric by dividing the hardware precision, by the expected process variation for that parameter, wherein the hardware precision is the square root of the diagonal of $C_p$.

12. The non-transitory machine-accessible storage medium as in claim 10, wherein the instructions for generating the test matrix further comprise instructions for:

iteratively assembling the test matrix, wherein for each successive iteration, N combinations of columns having one additional floating parameter than the previous test matrix iteration are copied from the Jacobian matrix and appended to all parameter combinations having the lowest relative precision metric determined from previous iterations; and wherein identifying one of the plurality of combinations further comprise instructions for:

floating the parameter combination having the lowest associated maximum relative precision metric when combined with parameters set to float in previous iterations;

terminating the iterative test matrix assembly in response to a maximum relative precision of the floated parameters reaching a threshold; and identifying as the set of parameters to fix, a set of the model parameters excluded from the combination floated in the last test matrix assembly iteration.

13. The non-transitory machine-accessible storage medium as in claim 10, further comprising instructions stored thereon which cause the data processing system to perform a method further comprising:

successively floating each parameter in a subset of fixed parameters, the fixed parameters excluded from a set corresponding to the parameter columns of the identified combination, the subset containing parameters having a relative precision metric within a threshold range the relative precision metric a function of the precision metric and an expected process variation associated with the parameter;

running a verifying regression after each additional parameter is floated; and fixing the additional parameter at a new fixed parameter value in response to an improvement in a residual of the verifying regression, the new fixed parameter value determined from the verifying regression.

14. The non-transitory machine-accessible storage medium as in claim 13, further comprising instructions stored thereon which cause the data processing system to perform a method further comprising:

determining a difference between the predetermined parameter value and the new fixed parameter value;

normalizing the difference to the parameter's precision metric; and re-computing a Jacobian matrix of the measured spectral information using the revised scatterometry model and new fixed parameter value in response to the normalized difference being greater than a threshold.

15. An optical metrology system for analysis of a sample diffracting structure having unknown parameters, the system comprising:

a scatterometry model preprocessor device configured to:

compute a Jacobian matrix of spectral information measured by the metrology system, the Jacobian matrix containing a column for each of a plurality of initial model parameters;

compute a test matrix including a plurality of combinations of parameter columns derived from the Jacobian matrix;

compute a relative precision metric for each of the parameter columns in the plurality of combinations, wherein the relative precision metric is a function of hardware precision for the parameter column and expected process variation for the parameter column;

associate, for each of the plurality of combinations, a maximum of the computed relative precision metrics with the corresponding combination; and identify one of the plurality of combinations having an associated maximum relative precision metric which is less than a threshold value, and which includes the greatest number of parameter columns, wherein parameters in the identified combination are to be floated in a revised scatterometry model; and a metrology processor device to run a regression on the measured spectral information with the revised scatterometry model and generate simulated spectral information, and determine a physical characteristic of the diffracting structure based on the simulated spectral information.

16. The optical metrology system as in claim 15, wherein the scatterometry model preprocessor device is further configured to:

successively float each parameter in a subset of fixed parameters, the fixed parameters excluded from a set corresponding to the parameter columns of the identified combination, the subset containing parameters having a relative precision metric within a threshold range, the relative precision metric a function of the precision metric and an expected process variation associated with the parameter;

perform a verifying regression after each additional parameter is floated; and fix the additional parameter at a new fixed parameter value in response to an improvement in a residual of the verifying regression, the new fixed parameter value determined from the verifying regression.

17. The optical metrology system as in claim 15, wherein the scatterometry model preprocessor device is further configured to:

determine a difference between the predetermined parameter value and the new fixed parameter value;
normalize the difference to the parameter's precision metric; and
re-compute a Jacobian matrix of the measured spectral information using the revised scatterometry model and new fixed parameter value in response to the normalized difference being greater than a threshold.

* * * * *